(12) United States Patent
Gass

(10) Patent No.: US 7,234,088 B2
(45) Date of Patent: Jun. 19, 2007

(54) METHOD AND APPARATUS FOR GENERATING SIGNAL TRANSITIONS USED FOR TESTING AN ELECTRONIC DEVICE

(75) Inventor: Robert Benjamin Gass, Pflugerville, TX (US)

(73) Assignee: International Business Machines Corporation, Armonk, NY (US)

( * ) Notice: Subject to any disclaimer, the term of this patent is extended or adjusted under 35 U.S.C. 154(b) by 445 days.

(21) Appl. No.: 10/651,168

(22) Filed: Aug. 28, 2003

(65) Prior Publication Data

US 2005/0050418 A1 Mar. 3, 2005

(51) Int. Cl.
*G01R 31/28* (2006.01)

(52) U.S. Cl. ............... 714/725; 714/726; 714/727; 714/731; 714/744

(58) Field of Classification Search ........... 714/726, 714/727
See application file for complete search history.

(56) References Cited

U.S. PATENT DOCUMENTS

| | | | | | |
|---|---|---|---|---|---|
| 4,677,614 | A | * | 6/1987 | Circo | 370/222 |
| 4,692,641 | A | * | 9/1987 | Highton | 326/78 |
| 5,689,517 | A | * | 11/1997 | Ruparel | 714/731 |
| 5,764,656 | A | * | 6/1998 | Pelella et al. | 714/726 |
| 6,388,533 | B2 | * | 5/2002 | Swoboda | 331/57 |
| 6,895,061 | B1 | * | 5/2005 | Stong | 375/354 |
| 2002/0093368 | A1 | * | 7/2002 | Fulkerson | 327/203 |
| 2004/0075479 | A1 | * | 4/2004 | Gupta | 327/202 |

* cited by examiner

*Primary Examiner*—Albert Decady
*Assistant Examiner*—Saqib J. Siddiqui
(74) *Attorney, Agent, or Firm*—Duke W. Yee; Casimer K. Salys; Wayne P. Bailey

(57) ABSTRACT

The present invention is directed to an improved method, system and apparatus for self-testing an electronic device. A scan latch used in a multi-cycle bus is uniquely operated to generate signal transitions consistent with the normal operating speed of the device. This occurs even when a normal signal transition would not otherwise occur since the multi-cycle bus normally requires a plurality of clock pulses to create such signal transition. The logical states of master and slave clocks associated with test scan logic are used to automatically cause the output of a scan latch to invert its output or switch from its previous state at each rising edge of the slave clock that is not preceded by a master or scan clock. This ensures transitions will appear at the output of the latch consistent with the operating clock speed of the slave clock, and these transitions are detected during an AC test of the device to determine the maximum operation frequency of the device even when the device contains an internal multi-cycle bus.

10 Claims, 4 Drawing Sheets

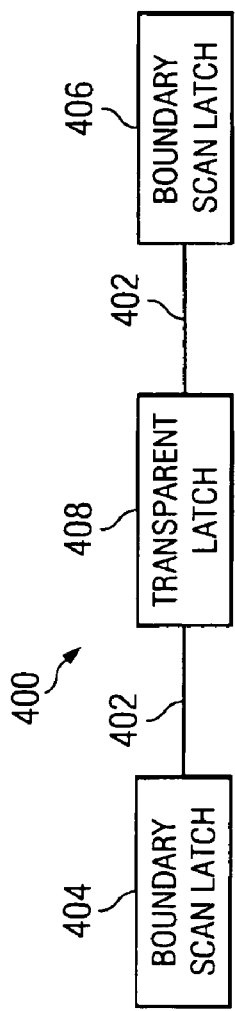
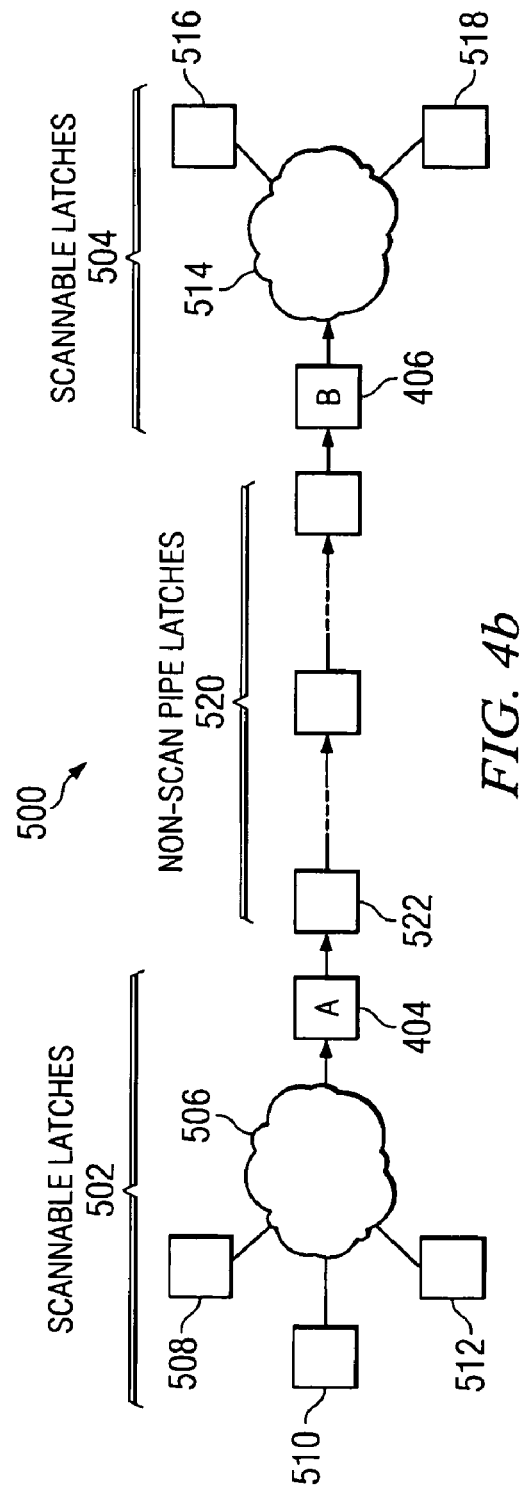

METHOD AND APPARATUS FOR GENERATING SIGNAL TRANSITIONS USED FOR TESTING AN ELECTRONIC DEVICE

BACKGROUND OF THE INVENTION

1. Technical Field

The present invention relates to electronic testing techniques, and more particularly relates to an improved method and system for electronic self-testing.

2. Description of Related Art

Improvements in manufacturing processes are enabling integrated circuit devices to offer more functionality as the size of individual transistors contained therein get smaller and smaller, thus allowing more transistors to be packaged within an integrated circuit device. As the trend of integrating more functions in a single high performance integrated circuit device (also called a chip) continues, testing of such devices is crucial to ensure a proper functioning device. One test technique is to connect a device under test to an external tester, which applies input stimuli, captures the resulting output, and compares this captured output to an expected output to determine if the device is functioning properly. Rather than using a tester to apply external patterns, an alternate test technique known as Logical built-in self-test (LBIST) uses an embedded pseudo-random pattern generator to generate input values to apply to a device's internal scan chain. A functional cycle (one or more clock pulses) is then run, and the device's response is captured in scannable latches. These captured values can then be scanned out and compressed using a multiple input signature register (MISR) to generate a signature that can be compared with a known good signature see if there were any faults.

LBIST can also be used to test the frequency characteristics of a chip. Data is scanned into the scan latches at the front end of the circuit-under-test. Then, after waiting a few cycles for the scan paths to stabilize, two functional clock cycles are issued back to back. The first functional clock cycle captures the scanned in data, which causes a signal transition to begin propagating through the circuits towards a capture latch's output. This transition occurs when the scanned in data is different from the data at the normal input to the circuit, thus causing a change in state at the output of the circuit and hence a signal transition. That transition is then captured during the second functional clock cycle by other capture latches. If the frequency is too fast, the second functional clock will be issued before the transition can propagate to the capture latch, and a fault will occur and be detected by LBIST. By increasing the frequency until a fault is produced, the highest operational frequency of the circuit can be found.

A chip will normally have various clocks and control methods to test and operate the chip. The master clock is the clock that drives the data input stage of a master-slave flip-flop latch, and the slave clock is the clock that drives the output stage of a master-slave flip-flop latch. The scan clocking scheme is used to scan data into and out of the scan latches.

As chips are getting larger and larger, it sometimes takes multiple cycles for data to get from one part of the chip to another. If a signal is going to take more than one cycle to get to its destination, it must be latched for each cycle. However, due to placement restrictions, timing and area concern, it is often desirable to use non-scan latches for this purpose. Then, during testing, the clocks to these latches are left running to propagate data through to the receiving scannable latch. However, this causes a problem when trying to characterize the frequency of the device during an AC test. Because the latches propagating the data are non-scan, there is no way to produce a transition that can be captured by the latches at the receiving end in one cycle since it takes multiple cycles for data to get from one part of the chip to another. This can be solved by issuing more functional cycles, but that makes diagnosing and isolating the fails much more difficult.

It would thus be desirable to provide an improved way for characterizing the AC operational speed of an electronic device.

SUMMARY OF THE INVENTION

The present invention is directed to an improved method, system and apparatus for self-testing an electronic device. A scan latch used in a multi-cycle bus is uniquely configured to generate signal transitions consistent with the normal operating speed of the device. This occurs even when a normal signal transition would not otherwise occur since the multi-cycle bus normally requires a plurality of clock pulses to create such signal transition. The logical states of master and slave clocks associated with test scan logic are used to automatically cause the output of the scan latch to invert its output or switch from its previous state at each rising edge of the slave clock that is not preceded by a master or scan clock. This ensures transitions will appear at the output of the latch consistent with the operating clock speed of the slave clock, and these transitions are detected during an AC test of the device to determine the maximum operation frequency of the device even when the device contains an internal multi-cycle bus.

BRIEF DESCRIPTION OF THE DRAWINGS

The novel features believed characteristic of the invention are set forth in the appended claims. The invention itself, however, as well as a preferred mode of use, further objectives and advantages thereof, will best be understood by reference to the following detailed description of an illustrative embodiment when read in conjunction with the accompanying drawings, wherein:

FIG. 4a depicts a representative multi-cycle internal bus of an integrated circuit device have a non-scan or transparent latch.

FIG. 4b depicts a multi-cycle internal bus of an integrated circuit device having a plurality of non-scan or transparent latches.

DETAILED DESCRIPTION OF THE PREFERRED EMBODIMENT

Figure 1:
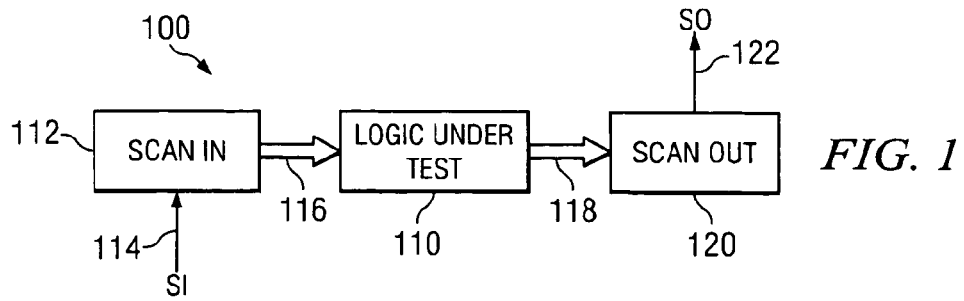
FIG. 1 depicts a logic/circuitry to be tested using internal scan techniques.

FIG. 1 shows a traditional scan test architecture at 100. Logic or circuitry to be tested is shown at 110. The normal inputs and outputs used when the device is functioning in its normal operating mode are not shown for ease of clarity. Test patterns are serially scanned into scan in latch 112 using the scan-in or serial-in input line 114 and presented at 116 to the input of the logic to be tested. After a slight delay to allow the scanned-in data to settle or stabilize at input 116, a series of clock pulses are applied to the logic 110 to exercise the logic. Then, the data appearing at the output 118 of logic 110 is latched into scan out latch 120. The data is then serially scanned out of the scan out latch 120 at serial out 122 where it can be processed by a MISR or other type of signature or pattern generating device (not shown) for comparison with a known good signature or pattern.

Although FIG. 1 shows that latch 112 is a scan in latch and latch 120 is a scan out latch, this is merely shown this way for ease of clarity. Typically, these latches function as both a scan in latch and a scan out latch (although at different times, as determined by the clock signals applied to the latch) and would have logic to be tested connected to both their input side and output side, as is commonly known in the art. When used herein, if the latch is being used to input test data into logic under test 110, it will be called a scan latch, and if the latch is being used to capture the output data from the logic under test 110, it will be called a capture latch.

Scan latches 112 and 120 are typically comprised of a plurality of scan cells that are daisy chained or coupled together to create the desired width or number of bit lines that are required to be coupled to the logic/circuitry under test. The logical representation of a typical single bit scan cell is shown at 200 in FIG. 2. It has two stages connected together, a master or input stage 202 at the front end and a slave or output stage 204 at the back end. The master/input stage 202 has two inputs, Scan In 206 and Data In 208. The clocks are not shown in this logical representation for ease of clarity. If this is the first scan cell in the scan chain, the Scan In input 206 corresponds to the SI input 114 shown in FIG. 1. If this is not the first scan cell in the scan chain, this Scan In line 206 would be connected to the Scan Out line of an adjoining scan cell as part of the daisy chain. The slave/output stage 204 has two outputs, Scan Out 210 and Data Out 221. If this is the last scan cell in the scan chain, the Scan Out output 210 corresponds to the SO output 122 shown in FIG. 1. If this is not the last scan cell in the scan chain, this Scan Out line 210 would be connected to the Scan In line of an adjoining scan cell as part of the daisy chain. Data Output line 212 of slave/output stage 204 is one bit of the overall output 116 of scan latch 112 (shown in FIG. 1). Again, a plurality of these scan cells are connected together to create the desired bit width of the logic/circuit under test, such as the width of 116 or 118 shown in FIG. 1.

Figure 2:
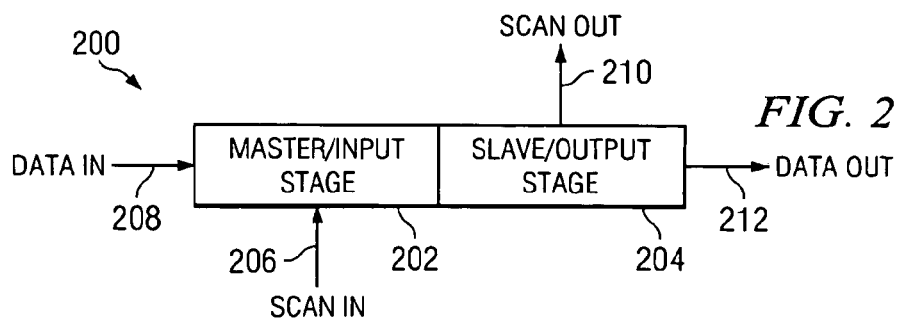
FIG. 2 depicts a typical internal scan cell.
Figure 3:
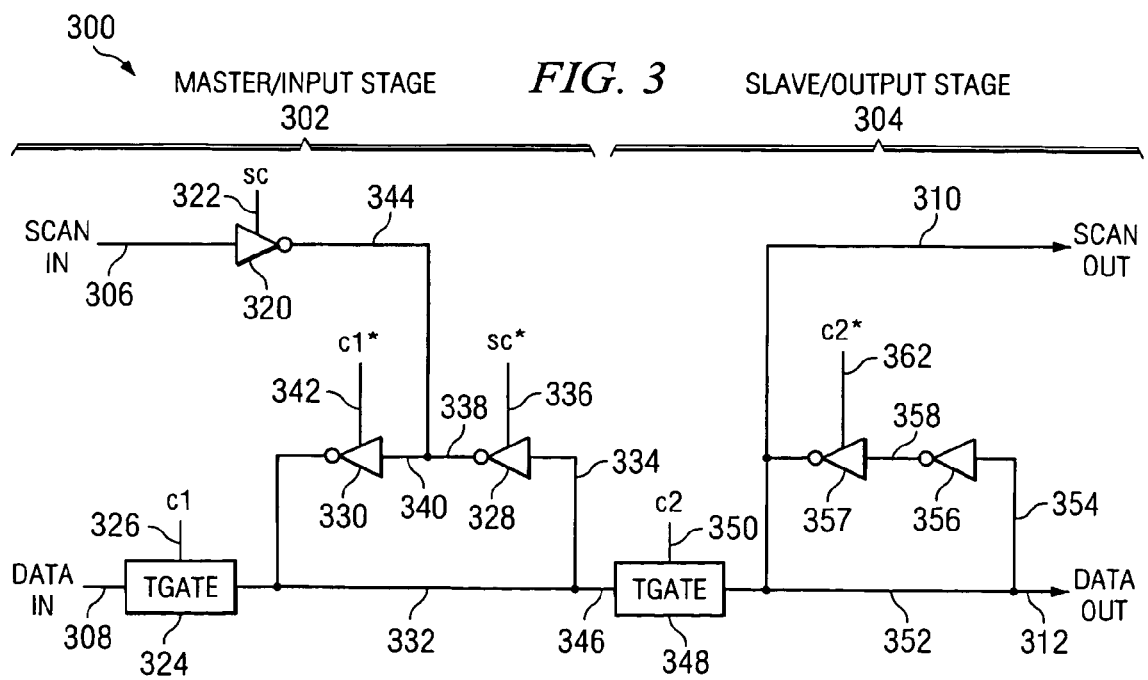
FIG. 3 depicts a representative hardware implementation of an internal scan cell.

Turning now to FIG. 3, there is shown a hardware implementation of the logical scan cell shown in FIG. 2. This master-slave flip-flop latch 300 comprises a master/input stage 302 (corresponding to master/input stage 202 shown in FIG. 2) and a slave/output stage 204 (corresponding to slave/output stage 204 shown in FIG. 2). Master/input stage 302 has two inputs Scan In 306 and Data In 308. Scan In 306 is coupled to gated inverter 320. The gated inverter 320 has a scan clock (sc) signal coupled to its gate input 322. Data In 308 is coupled to an input of transmission gate (T gate) 324 (the complementary input of this transmission gate is not shown for ease of clarity). Transmission gate 324 has a master clock (c1) signal coupled to its gate input 326. Master/input stage 302 also includes two gated inverters 328 and 330. Gated inverter 328 has the output 332 of T gate 324 coupled to its input 334. Gated inverter 328 has an inverted scan clock (sc*) coupled to its gate input 336. Gated inverter 330 has the output 338 of gated inverter 328 coupled to its input 340. Gated inverter 330 has an inverted master clock (c1*) coupled to its gate input 342. The output 344 of gated inverter 320 is also coupled to the input 340 of gated inverter 330.

Slave/output stage 304 has two outputs Scan Out 310 and Data Out 312, and an input 346. The output of the master/input stage 302, which is also the output 332 of T gate 324, is coupled to the input 346 of slave/output stage 304, which is also the input to T gate 348. T gate 348 has a slave clock (c2) signal coupled to its gate input 350. The output 352 of T gate 348 is the Data Out signal 312. This output 352 is also coupled to input 354 of inverter 356. The output of inverter 356 is coupled to input 358 of gated inverter 357. Gated inverter 357 has an inverted slave clock (c2*) coupled to its gate input 362. The output of gated inverter 357 is coupled to both the Scan Out signal 310 and the output 352 of T gate 348.

This master-slave flip-flop scannable latch 300 works as follows. There are three clock inputs c1, sc and c2. There are two data inputs Data In and Scan In and two data outputs Scan Out and Data Out. Clocks c1 and c2 are logically orthogonal, so when one is at a logical one the other is at a logical zero. Furthermore, clocks c1 and sc are also logically orthogonal such that when one is a logical one, the other is a logical zero. When either c1 or sc is a logical one, data passes from Data In or Scan In, respectively, to the input stage of the latch. When c1 or sc goes to a logical zero, the data passed into the input stage is stored. When c2 is at a logical one, the stored data from the input stage passes to the output stage when it passes to Data Out and Scan Out. When c2 goes to a logical zero, the output stage stores the value passed into it, and maintains the values of Data Out and Scan Out.

As previously mentioned, an LBIST controller or core is included with the functional logic of an integrated circuit device in order to generate test patterns to be scanned into such functional logic in order to test it. In addition, the LBIST controller can also be used to perform an AC test of the device to determine the maximum clock speed that it can properly operate without generating a fault. However, with some designs it is no longer possible to guarantee that a given input signal applied at the input of a logical block under test (such as that shown at 110 in FIG. 1) will arrive at the output in a single clock cycle. This is generally because of the larger size and complexity of integrated circuit devices, with an associated increase in signal paths. Thus, multiple clock cycles may be required before an input signal reaches its ultimate destination. In such a multi-cycle design, in order to perform an AC test, the functional logic values applied at the input and appearing at the output can no longer be used to generate transitions because there is no guarantee that the signal at the input scan latch will appear at the output capture latch in time to be captured by the slave clock. Because a key aspect of an AC test is detecting transitions at every clock cycle, what is needed is a way to ensure such a transition in a multi-cycle design for each clock cycle, thereby indicating that the particular cell being driven is capable of operating at that clock speed.

Turning now to FIG. 4a, there is shown at 400 a representative block diagram of a multi-cycle bus 402 within an integrated circuit device. A boundary scan latch 404 (comprised of a plurality of boundary scan cells 300, as previously described) is positioned at the input to bus 402. Similarly, a boundary scan latch 406 is positioned at the output of bus 402. A non-scan or transparent latch 408 is positioned between boundary scan latches 404 and 406, such that data traveling along the bus can be latched at each clock cycle to ensure proper synchronous operation (by avoiding race conditions). This block diagram at 400 represents a two-cycle bus, since after the first functional cycle data will be captured by latch 408 and at the second functional cycle such data will continue along the bus and be captured by latch 406. For a three-cycle bus, another non-scan or transparent latch would be physically located along internal bus 402 at such a position as to ensure the signal path is short enough for proper signal propagation to the next latch along the bus during a single clock cycle. The preferred embodiment for this bus is shown in FIG. 4b.

FIG. 4b shows at 500 a plurality of scannable latches 502. Scannable latches 508, 510 and 512 drive logic 506. The output of logic 506 drives the Data In of latch 404. Scannable latch 406 drives logic 514 which in turn drives scannable latches 516 and 518. A plurality of non-scan pipe latches 520 are serially coupled between scan latch 404 and 406. Assume a given signal Z at the output of scannable latch 404 (labeled as A) takes more than one cycle to get from the output of A to the input of scannable latch 406 (labeled as B). Signal Z is latched with non-scan latches for each of the intermediate cycles that occur to ripple signal Z from latch A to latch B. The problem being solved herein is as follows.

During a scan operation, data is scanned into all the scan latches on the chip. Assume that latch A gets a value of 1 scanned in, such that it has a 1 at its output, and latch B gets a value of 0 scanned in. Also assume that logic 506 which is coupled to the input of latch A presents a 0 at the input to latch A after evaluating the values of 508, 510 and 512. After the scan, the system waits 256 cycles in the preferred embodiment during which time the clocks to the non-scan pipe latches are running so that the '1' from latch A propagates all the way to latch B during these wait cycles. However, the master clocks to all of the scannable latches have not been running during this wait state. Now there is a value of '0' setting at the input of latch A (which still holds the scan value of '1'), and a '1' setting at the input of latch B (which still holds the scan value of 0). The first functional clock cycle is then issued, and the output value of latch A takes the new value of 0 from its input. Latch B will change from a 0 to a 1 during this same functional clock cycle. The transition produced from latch A will only make it to the first non-scannable latch in the bus (latch 522) so a fault could not be detected.

Several key enabling features are required to perform an AC test of a multi-cycle logical design. First, the master clock should be completely controllable so that it can be selectively turned on (running) or off (disabled). Clocks to non-scannable or transparent latches contained within the internal bus or logic under test should be capable of being placed in a free running mode. The slave clock can be left free running at all times during the test. Finally, after a scan, there should be a controllable number of wait cycles before functional clocks are issued.

By including the above enabling features in the overall device design, it is now possible to guarantee a transition for each clock pulse as part of the AC test. Then, it is possible to increase the clock speed until a fault is detected to determine the maximum operating frequency of the device under test. This is made possible by a new type of master-slave flip flop latch that can invert its output data when a slave clock appears at its input which is not preceded by a master clock or a scan clock at its input. In other words, when there is no master clock driving this latch, the output of the latch inverts its value at each rising edge of the slave clock. By using such a latch, the multi-cycle problem described above (where input data is not guaranteed to arrive at a capture latch in a single cycle) is overcome.

Figures 5A, 5B:
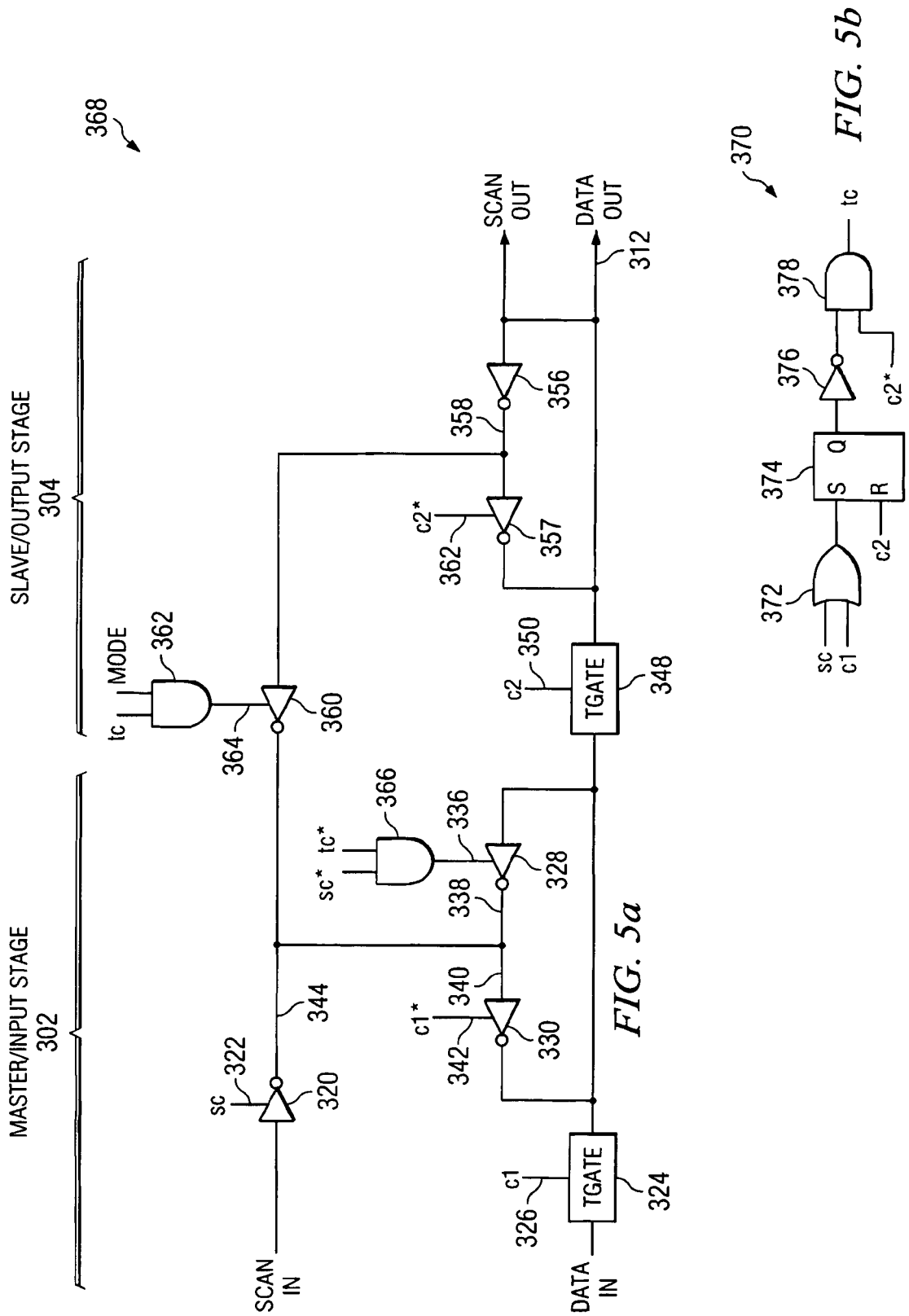
FIG. 5a depicts the detailed design of an improved latch with AC testing support.
FIG. 5b depicts a circuit for generating a tc clock signal.

The detailed design of such a latch is shown in FIG. 5a. As the circuit shown in FIG. 5a is a modification of that shown in FIG. 3 (which has already been described in detail), only the changes will be described in detail. It will be appreciated that the scope of the invention as described herein should not be limited to this specific circuit implementation. A feedback path is provided from the output stage to the input stage, as shown by gated inverter 360 having an input coupled to output 358 of gated inverter 356 and having an output coupled to input 340 of gated inverter 330. This additional gated inverter 360 has an AND gate coupled to its gated input 364, the AND gate having two inputs tc and mode. tc is a clock signal whose derivation will be further described below. Mode is an optional mode control signal to selectively enable/disable the guaranteed signal transition technique that is described herein. The gate input 336 of gated inverter 328 is no longer solely controlled by the inverted scan clock signal (sc*), but is now driven by an AND gate 366 which has two inputs sc* and tc* (which is an inverted tc clock signal). In order to understand the operation of this modified scan latch circuit, the derivation of the tc clock signal will now be described.

Referring now to FIG. 5b, a circuit for generating the tc clock signal is generally shown at 370. OR gate 372 has two inputs scan clock (sc) and master clock (c1). The output of OR gate 372 is coupled to the S input of SR latch 374. The slave clock (c2) is coupled to the R input of SR latch 374. The Q output of SR latch 374 is coupled to the input of inverter 376, and the output of inverter 376 is coupled to an input of AND gate 378. Inverted slave clock (c2*) is coupled to another input of AND gate 378, with the output of AND gate 378 being the tc clock. In operation, if master clock c1 is running, the S input to the SR flip flop will be a 1 and the Q output will similarly be at a 1 value. When inverted by inverter 376, a 0 is presented at one of the inputs to AND gate 378, thus disabling or making tc a 0 value. When tc is at a zero value, and referring now to FIG. 5a, the gate input signal to feedback inverter gate 360 is at a 0, which disables the feedback path and the circuit operates in its normal fashion. However, and referring again to FIG. 5b, if a slave clock pulse occurs that is not preceded by a master clock pulse or scan clock pulse, clock signal tc will be the same as the inverted slave clock (c2*) (since slave clock c2 resets the SR latch 374 thereby causing a 0 at its output and a 1 at the input to AND gate 378). The feedback gated inverter 360 of FIG. 5a will then be gated by the inverted slave clock which is free-running. And since the Data Out signal 312 passes through three inverters 356, 360 and 330 in its feedback path to the input of T gate 348, the Data Out signal will toggle or transition on each slave clock cycle.

In accordance with the present invention, the scannable latch 368 shown in FIG. 5a is used for scan latch A in FIG. 4b (indicated by reference number 404) in order to ensure data transitions occur at each slave clock pulse.

Figure 6:
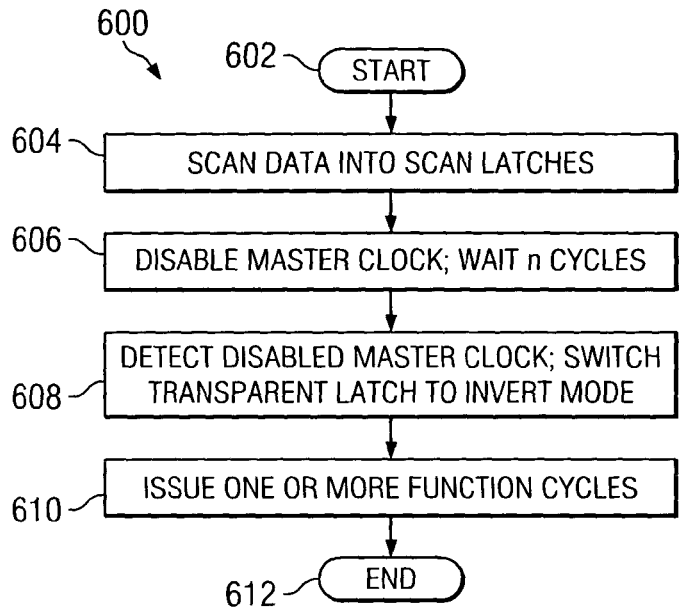
FIG. 6 depicts a flow chart of the operation flow of the overall test flow.

A flow chart will now be described to show the functional operation of the overall design. Referring to logical flow 600 in FIG. 6, the process starts at 602 and proceeds to 604 where data is scanned into the scan latches using traditional techniques as previously described. Then, a delay is induced by waiting a predetermined number of cycles at step 606. In the preferred embodiment, there is a 256 cycle delay. During this wait period the slave clocks continue to run, but no master clocks are issued (i.e. they are selectively disabled). The modified master-slave latch circuit detects this condition, and switches to its output invert mode at 608 where the data at its output is inverted from its previous value at each slave clock cycle. This causes a data signal transition to occur for each slave clock cycle. Since this latch is used to drive the non-scannable latch portion of the multi-cycle bus or logic, this latch generates transitions that propagate down the signal's multi-cycle path. At step 610, two functional cycles are issued to capture the transitions. Generally, only one functional cycle would be necessary to test the multi-cycle signals and capture the transitions, but two cycles need to be issued to capture normal one cycle data and logic paths. For example, returning to FIG. 4b, latch 406 drives latches 516 and 518 in the normal manner through logic 514. Assume that the bus works fine and that there isn't any faults getting from latch 404 to 406. After a scan, latch 406 has a 0. During the wait cycles nothing changes—it still has a 0. When the first functional clock is issued the value for latch 406 changes from 0 to 1, and thus a transition begins to propagate through logic 514. If another functional clock cycle were not issued, this transition would not be captured and AC faults in logic 514 would not be detected. By issuing another clock cycle the transition can be captured by latch 516 or 518. The process then ends at 614.

Figure 7:
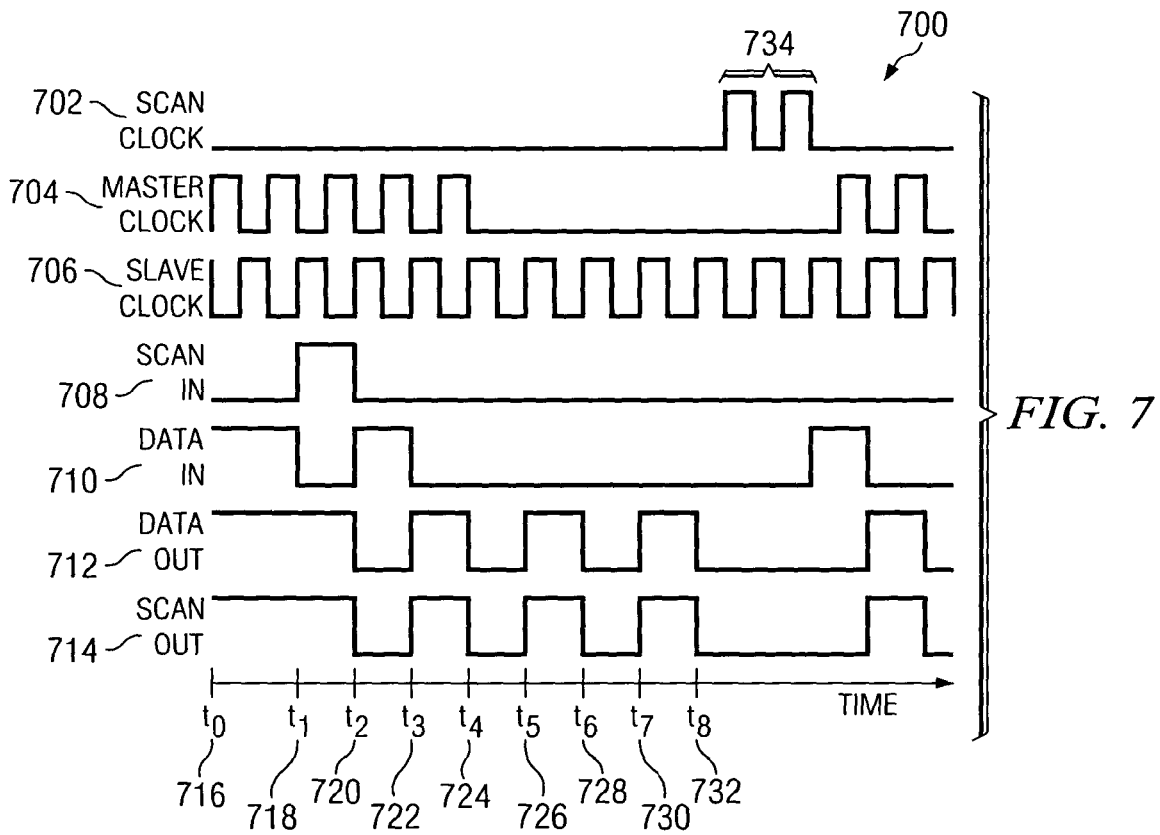
FIG. 7 depicts a representative timing diagram showing various clock and data signals.

Referring now to FIG. 7, there is shown a timing diagram at 700 of various system signals and their interplay. This timing diagram shows Scan Clock 702, Master Clock 704, Slave Clock 706, Scan In signal 708, Data In signal 710, Data Out signal 712 and Scan Out signal 714. At time t0, shown at 716, the master and slave clocks 704 and 706 are both in a free running, normal operating mode. At time t1, shown at 718, the Scan In signal 708 goes to a logical 1 and the Data In signal goes to a logical 0. This causes the Data Out signal 712 to go to a logical 0 at the next rising edge of slave clock 706 at time t2 (shown at 720). Also at time t2, the Data In signal switches to a logical 1, causing the Data Out signal 712 to switch to a logical one at the next rising edge of slave clock 706 (which occurs at time t3 (shown at 722)). At time t4 (shown at 724), the master clock is disabled, and in accordance with the present invention, this causes the Data Out signal 712 to begin to invert or switch from its prior state at each rising edge of slave clock 706. Hence, at time t4 it switches/inverts to a logical 0, at time t5 it switches/inverts to a logical 0, at time t6 it switches/inverts to a logical 1, etc.

It should also be noted that the scan functions are still operational even when the master clock has been disabled. This can be seen at 734 where two scan clock pulses are issued, causing the Scan In value of 0 to be propagated to the Scan Out and Data Out outputs during the next rising edge of the slave clock (c2), and thus it is no longer inverting data.

The present invention thus provides an improved technique for testing an electronic device. The latches used in a multi-cycle bus are uniquely operated to generate signal transitions consistent with the normal operating speed of the device. This occurs even when a normal signal transition would not otherwise occur due to the characteristics of the internal multi-cycle bus. The logical states of Master and slave clocks associated with test scan logic are used to automatically cause the output of a non-scan or transparent latch to invert its output or switch from its previous state at each rising edge of the slave clock that is not preceded by a master clock. This ensures transitions will appear at the output of the latch consistent with the operating clock speed of the slave clock, and these transitions are detected during an AC test of the device to determine the maximum operation frequency of the device even when the device contains an internal multi-cycle bus.

It is important to note that while the present invention has been described in the context of a fully functioning data processing system, those of ordinary skill in the art will appreciate that the processes of the present invention are capable of being distributed in the form of a computer readable medium of instructions and a variety of forms and that the present invention applies equally regardless of the particular type of signal bearing media actually used to carry out the distribution. Examples of computer readable media include recordable-type media, such as a floppy disk, a hard disk drive, a RAM, CD-ROMs, DVD-ROMs, and transmission-type media, such as digital and analog communications links, wired or wireless communications links using transmission forms, such as, for example, radio frequency and light wave transmissions. The computer readable media may take the form of coded formats that are decoded for actual use in a particular data processing system.

The description of the present invention has been presented for purposes of illustration and description, and is not intended to be exhaustive or limited to the invention in the form disclosed. Many modifications and variations will be apparent to those of ordinary skill in the art. For example, while the preferred embodiment is shown as electronic circuitry, it would also be possible to implement the inventive concepts in microcode or other form of software routine. The embodiment was chosen and described in order to best explain the principles of the invention, the practical application, and to enable others of ordinary skill in the art to understand the invention for various embodiments with various modifications as are suited to the particular use contemplated.

What is claimed is:

1. A method for testing of an electronic device having at least one scan latch with a master clock input, a slave clock input, and a scan clock input, comprising:
    enabling a master clock coupled to the master clock input;
    enabling a slave clock coupled to the slave clock input;
    enabling a scan clock at the scan clock input;
    selectively disabling the master clock;
    selectively disabling the scan clock; and
    in response to both the master clock and the scan clock being disabled, inverting data currently existing at an output of the scan latch upon each successive clock pulse of the slave clock to operationally test the electronic device.

2. The method of claim 1 further comprising the step of monitoring signals generated by the output of the scan latch to determine maximum AC frequency operational characteristics of the electronic device.

3. The method of claim 2 further comprising the step of varying frequency of a functional clock signal of the electronic device, and wherein the monitoring step comprises the step of detecting signal transitions generated by the scan latch while concurrently varying the frequency of the functional clock signal.

4. A system for testing of an electronic device having at least one scan latch with a master clock input, a slave clock input, and a scan clock input , comprising:
    means for enabling a master clock at the master clock input;
    means for enabling a slave clock at the slave clock input;
    means for enabling a scan clock at the scan clock input;
    means for selectively disabling the master clock signal;
    means for selectively disabling the scan clock; and
    means, in response to both the master clock and scan clock being disabled, for inverting data currently existing at an output of the scan latch upon each successive clock pulse of the slave clock to operationally test the electronic device.

5. The system of claim 4 further comprising means for monitoring signals generated by the output of the scan latch to determine maximum AC frequency operational characteristics of the electronic device.

6. The system of claim 5 further comprising means for varying frequency of a functional clock signal of the electronic device, and wherein the means for monitoring comprises means for detecting signal transitions generated by the scan latch while concurrently varying the frequency of the functional clock signal.

7. An integrated circuit device under test having a multi-cycle bus comprising a plurality of non-scan latches serially connected together, said multi-cycle bus coupled to at least one latch of the plurality of non-scan latches, wherein at least one latch inverts data currently existing at the output of the latch for every slave clock cycle not preceded by both a master clock cycle and a scan clock cycle during testing of the integrated circuit device, wherein both the master clock and the scan clock are disabled while data is being inverted at the output of the latch upon each successive clock pulse of the slave clock.

8. A master/slave scan latch, comprising:
an input stage having a master clock input, a scan input, a scan clock input and a data input;
an output stage coupled to the input stage, the output stage having a slave clock input and a data output;
wherein the master/slave latch is selectively operable to invert its output value at the data output on each successive clock pulse appearing at the slave clock input during a frequency test of the master/slave scan latch when a scan clock at the scan clock input and a master clock at the master clock input are both disabled.

9. The master/slave latch of claim 8, wherein the master/slave latch is selectively operable to invert its output value when it receives a slave clock pulse at the slave clock input that is not preceded by a master clock pulse at the master clock input.

10. The method of claim 3, wherein a maximum operating frequency of the electronic device is determined when the signal transitions are no longer detectable due to the varying of the frequency.

* * * * *